United States Patent
Wann et al.

(10) Patent No.: US 8,609,517 B2
(45) Date of Patent: *Dec. 17, 2013

(54) MOCVD FOR GROWING III-V COMPOUND SEMICONDUCTORS ON SILICON SUBSTRATES

(75) Inventors: Clement Hsingjen Wann, Carmel, NY (US); Chih-Hsin Ko, Fongshan (TW); Cheng-Hsien Wu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 182 days.

This patent is subject to a terminal disclaimer.

(21) Appl. No.: 12/814,088

(22) Filed: Jun. 11, 2010

(65) Prior Publication Data

US 2011/0306179 A1 Dec. 15, 2011

(51) Int. Cl.
*H01L 21/20* (2006.01)
*H01L 21/36* (2006.01)

(52) U.S. Cl.
USPC ............ 438/481; 257/E21.118; 257/E21.127; 257/E21.449; 257/E21.451; 257/E31.059; 257/189; 257/200; 257/615; 438/22; 438/285; 438/478; 438/604

(58) Field of Classification Search
USPC .................. 257/E21.118, E21.127, E21.449, 257/E21.451, E31.059, 189, 200, 615; 438/22, 285, 478, 481, 604
See application file for complete search history.

(56) References Cited

U.S. PATENT DOCUMENTS

| | | | | |
|---|---|---|---|---|
| 6,635,901 | B2 * | 10/2003 | Sawaki et al. .................. 257/80 |
| 8,183,134 | B2 * | 5/2012 | Wu et al. ........................ 438/481 |
| 2007/0267722 | A1 | 11/2007 | Lochtefeld et al. | |
| 2008/0099785 | A1 * | 5/2008 | Bai et al. ........................ 257/190 |
| 2009/0032799 | A1 * | 2/2009 | Pan ................................ 257/13 |

OTHER PUBLICATIONS

Pashley et al., "The effect of Cooling rate on the Surface Reconstruction of Annealed Silicon (111) Studied by Scanning Tunneling Microscopy and Low—Energy Electron Diffraction", J. Vac. Sci. Technol. A 6 (2), p. 486-492 (1986).*
Bartelt, N. C., et al., "Orientational Stability of Silicon Surfaces," J. Vac. Sci. Technol. A, vol. 7, No. 3, May/Jun. 1989, pp. 1898-1905.
Chabal, Y. J., et al., "Laser Quenched and Impurity Induced Metastable Si (111) 1x1 Surfaces," J. Vac. Sci. Technol., vol. 20, No. 3, Mar. 1982, pp. 763-769.
Li, J. Z., et al., "Defect Reduction of GaAs/Si Epitaxy by Aspect Ratio Trapping," Journal of Applied Physics, vol. 103, 2008, pp. 106102-1-106102-3.
Li, J. Z., et al., "Defect Reduction of GaAs Epitaxy on Si (001) Using Selective Aspect Ratio Trapping," Applied Physics Letters, vol. 91, 2007, pp. 021114-1-021114-3.

* cited by examiner

*Primary Examiner* — Asok K Sarkar
(74) *Attorney, Agent, or Firm* — Slater & Matsil, L.L.P.

(57) ABSTRACT

A device includes providing a silicon substrate; annealing the silicon substrate at a first temperature higher than about 900° C.; and lowering a temperature of the silicon substrate from the first temperature to a second temperature. A temperature lowering rate during the step of lowering the temperature is greater than about 1° C./second. A III-V compound semiconductor region is epitaxially grown on a surface of the silicon substrate using metal organic chemical vapor deposition (MOCVD).

14 Claims, 6 Drawing Sheets

MOCVD FOR GROWING III-V COMPOUND SEMICONDUCTORS ON SILICON SUBSTRATES

TECHNICAL FIELD

This disclosure relates generally to integrated circuit devices, and more particularly to the formation of III-V compound semiconductors on silicon substrates using metal organic chemical vapor deposition (MOCVD).

BACKGROUND

The speed of metal-oxide-semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (referred to as III-V compound semiconductors hereinafter) are good candidates for forming transistors due to their high electron mobility. Therefore, III-V based transistors have been explored. However, III-V compound semiconductor films need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high quality III-V compound semiconductors. For example, III-V compound semiconductors were grown from trenches between shallow trench isolation regions to reduce the number of threading dislocations.

III-V compound semiconductors may be formed on silicon substrates with a <111> surface orientation, which silicon substrates are known as Si(111) substrates. It was found that immediately after being cleaved or etched, Si(111) substrates may have 1×1 or 2×1 reconstructions (with the respective surfaces denoted as Si(111):1×1 surfaces or Si(111):2×1 surfaces hereinafter). However, after being annealed at about 400° C., the Si(111) surface may be reconstructed to form a stable Si(111):7×7 surface (which is a Si(111) surface with a 7×7 reconstruction). The Si(111):7×7 surfaces are not suitable for growing high-quality III-V compound semiconductors. Previous research has revealed that through annealing at temperatures higher than 900° C., the Si(111):7×7 surfaces may be converted back to Si(111):1×1 surfaces. However, III-V compound semiconductors needs to be grown at temperatures lower than 900° C. When the temperatures of Si(111) substrates are lowered to the temperatures for growth, the Si(111): 1×1 surfaces are again converted back to Si(111): 7×7 surfaces, and the resulting III-V compound semiconductors may have many stacking faults.

SUMMARY OF THE INVENTION

In accordance with one aspect, a device includes providing a silicon substrate; annealing the silicon substrate at a first temperature higher than about 900° C.; and lowering a temperature of the silicon substrate from the first temperature to a second temperature. A temperature lowering rate during the step of lowering the temperature is greater than about 1° C./second. A III-V compound semiconductor region is epitaxially grown on a surface of the silicon substrate using metal organic chemical vapor deposition (MOCVD).

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming III-V compound semiconductors comprising group III and group V elements is provided in accordance with an embodiment. The intermediate stages of manufacturing embodiments are illustrated. Throughout the various views and illustrative embodiments, like reference numbers are used to designate like elements.

Figure 1:
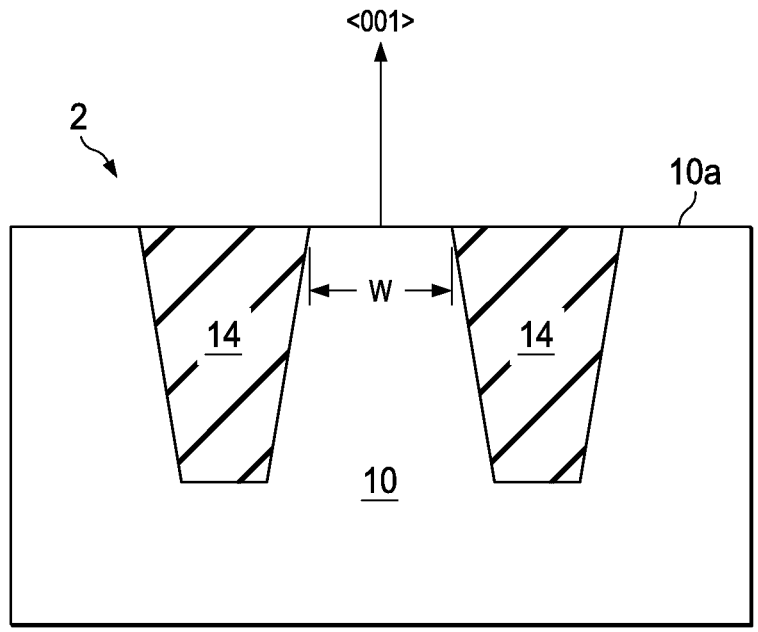
FIGS. 1 through 4C and FIGS. 7A through 7C are cross-sectional views and top views of intermediate stages in the epitaxial growth of a III-V compound semiconductor region on a silicon substrate in accordance with various embodiments.

Referring to FIG. 1, substrate 10, which is a part of semiconductor wafer 2, is provided. In an embodiment, substrate 10 is a Si(001) substrate with major surface 10a having <001> surface orientation, and the respective surface is referred to as a Si(001) surface hereinafter. Insulation regions such as shallow trench isolation (STI) regions 14 are formed in substrate 10. The formation of STI regions 14 includes forming openings (now filled with STI regions 14) in substrate 10, and filling the openings with a dielectric material(s). Distance W between opposite sidewalls of STI regions 14 may be less than about 1,000 nm, for example, although different widths W may be used.

Figure 2A:
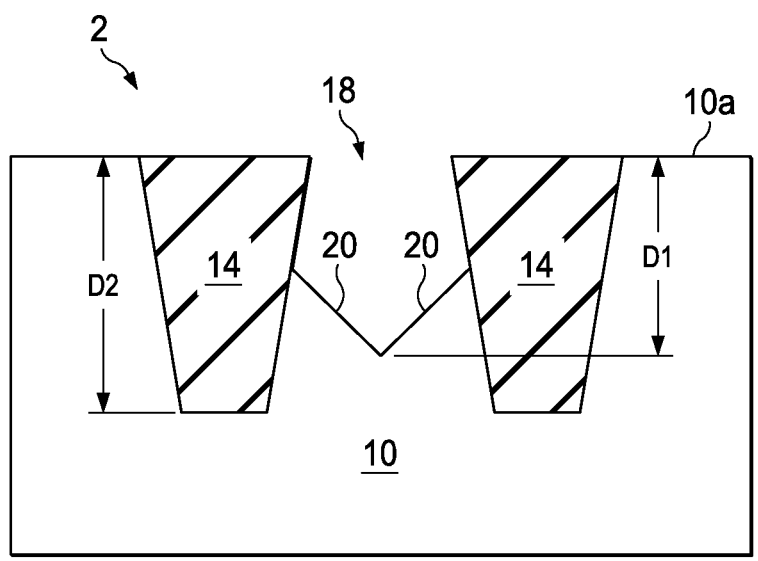

Next, as shown in FIG. 2A, the portion of substrate 10 between opposite sidewalls of STI regions 14 is etched to form trench 18. Recessing depth D1 may be less than thickness D2 of insulation regions 14. Furthermore, recessing depth D1 may be between about 100 nm and about 500 nm, for example. In an embodiment, the etching of substrate 10 is performed using a wet etch, with a KOH solution, for example, used as an etchant. Accordingly, slanted surfaces 20 are formed. Slant surfaces 20 may be substantially straight, and may be (111) surfaces, which are referred to as Si(111) surfaces hereinafter.

Figure 2B:
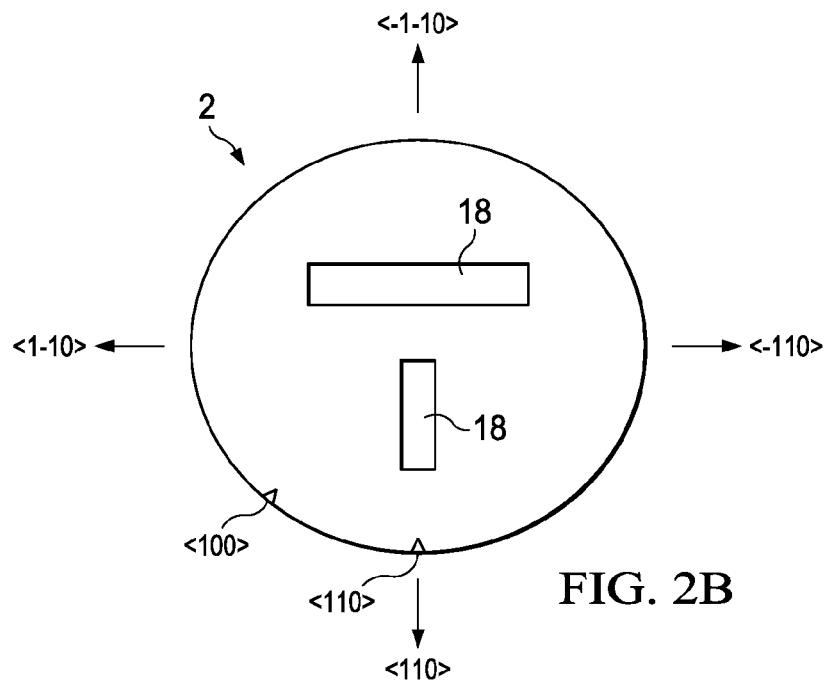

FIG. 2B illustrates a top view of wafer 2, wherein crystal directions <1-10>, <-110>, <-1-10>, and <110> of silicon substrate 10 are marked. The <110> and <100> notches are also marked. In an embodiment, the longitudinal direction of trench 18 is parallel to <1-10> and <-110> directions. Alternatively, the longitudinal direction of trench 18 is parallel to <-1-10> and <110> directions.

Figure 3:
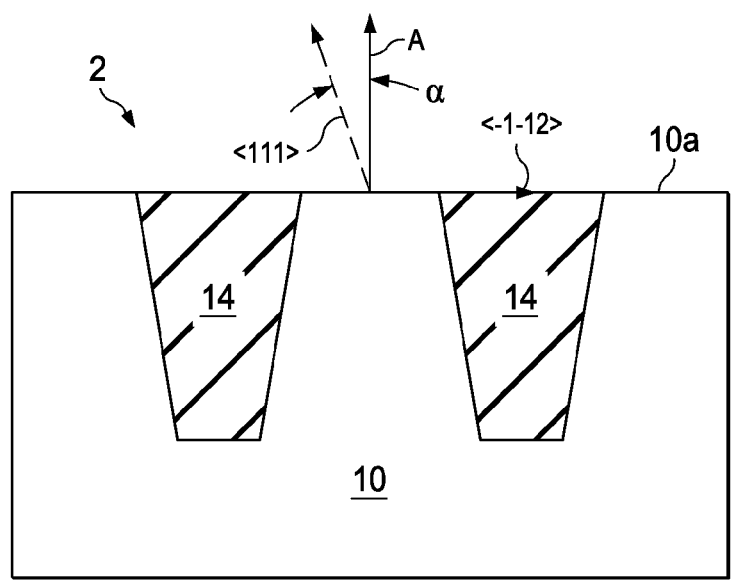
Figure 4A:
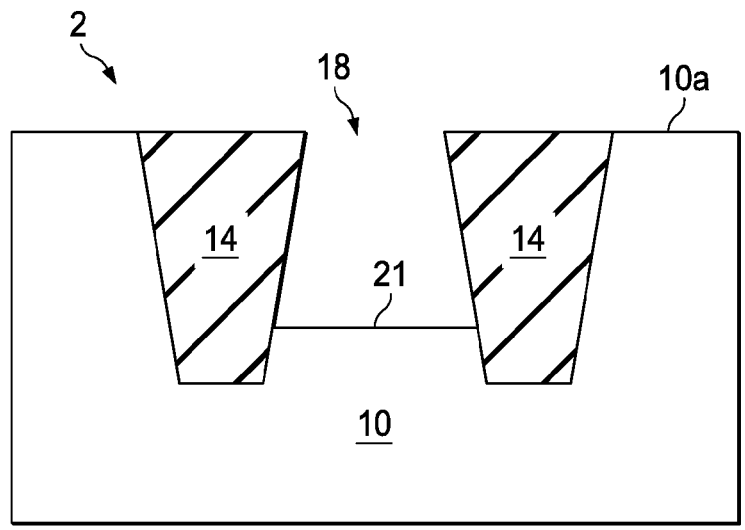
Figure 4B:
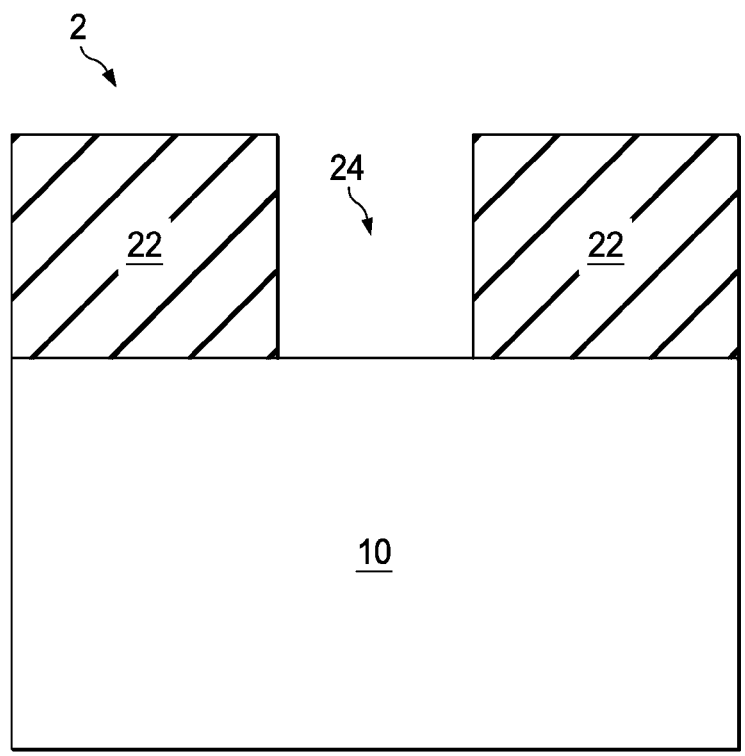

FIGS. 3 through 4B illustrate alternative embodiments, Referring to FIG. 3, substrate 10 is a Si(111) substrate with major surface 10a being a Si(111) surface. Alternatively, as shown in FIG. 3, surface orientation A of major surface 10a may be close to <111> direction (surface orientation), with off angle α. Off angle α may be greater than about 6 degrees, greater than about 12 degrees, greater than about 15 degrees, and may even be greater than about 20 degrees. Further, off angle α may be between about 6 degrees and about 12 degrees. In an embodiment, off angle α deviates from <111> direction and tilts toward <-1-12> direction, as schematically illustrated in FIG. 3. STI regions 14 is also formed in substrate 10.

Referring to FIG. 4A, trench 18 is formed by etching the portion of substrate 10 between opposite sidewalls of STI regions 14. In an embodiment, an etchant that attacks silicon in <111> direction more than other directions is used, so that substantially flat bottom 21 is formed. Accordingly, bottom surface 21 has essentially the same surface orientation as major surface 10a. In an exemplary embodiment, the etchant is an HCl solution.

In alternative embodiments, as shown in FIG. 4B, instead of forming STI regions 14 in substrate 10 and then recessing substrate 10, dielectric layer 22 is formed on surface 10a of substrate 10, for example, using a deposition method. A portion of surface 10a is exposed through trench 24 in dielectric layer 22. Dielectric layer 22 may be formed of silicon oxide, silicon nitride, or the like. Using this method, the exposed portion of surface 10a also has the original surface orientation.

Figure 4C:
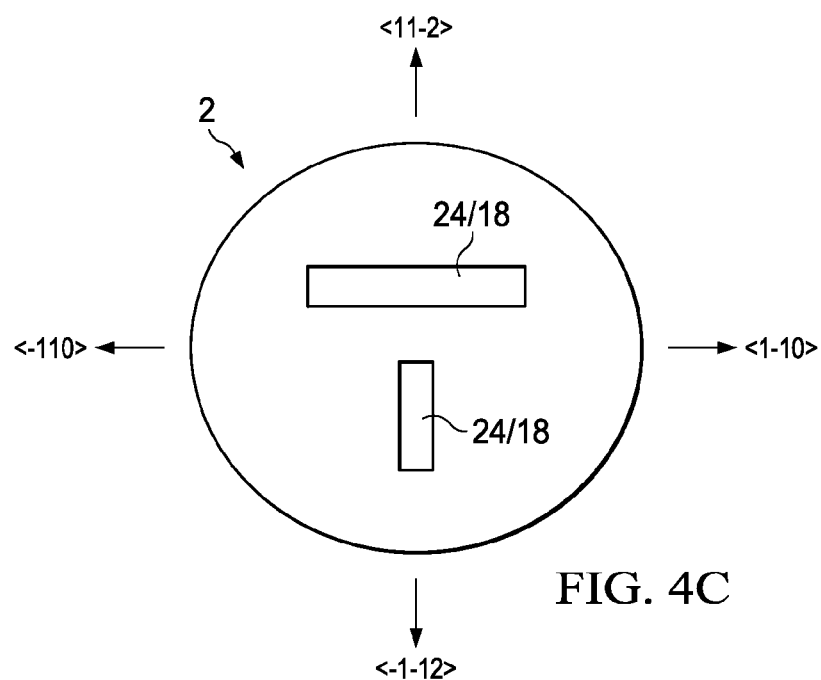

FIG. 4C illustrates a top view of the structure shown in FIG. 4A or 4B, wherein crystal directions of silicon substrate 10 are marked. In an embodiment, the longitudinal direction of trench 24/18 is parallel to <-110> and <1-10> directions. Alternatively, the longitudinal direction of trench 24 is parallel to <11-2> and <-1-12> directions.

It is observed that the Si(111) surfaces may have 1×1 reconstructions (with the respective surfaces referred to as Si(111):1×1 surfaces hereinafter), for example, immediately after substrate 10 cleaved or etched. The Si(111): 1×1 surface may be undesirably converted to surfaces having a stable 7×7 reconstruction, which surfaces are referred to as Si(111):7×7 surfaces hereinafter. Since Si(111):7×7 surfaces are not suitable for growing III-V compound semiconductors, an annealing is performed on wafer 2 (as shown in FIGS. 2A, 4A, and 4B) to convert the Si(111):7×7 surfaces back to Si(111): 1×1 surfaces. The annealing temperature may be between about 500° C. and about 900° C., or even greater than about 900° C. In an exemplary embodiment, the annealing temperature is about 1000° C. During the annealing, process gases such as $N_2$ and $AsH_3$ may be introduced into the annealing chamber. The duration of the annealing may be between about 1 minute and about 30 minutes. After the annealing, the likely Si(111): 7×7 surfaces at the bottom of trench 18/24 are converted to Si(111): 1×1 surfaces.

Figure 5:
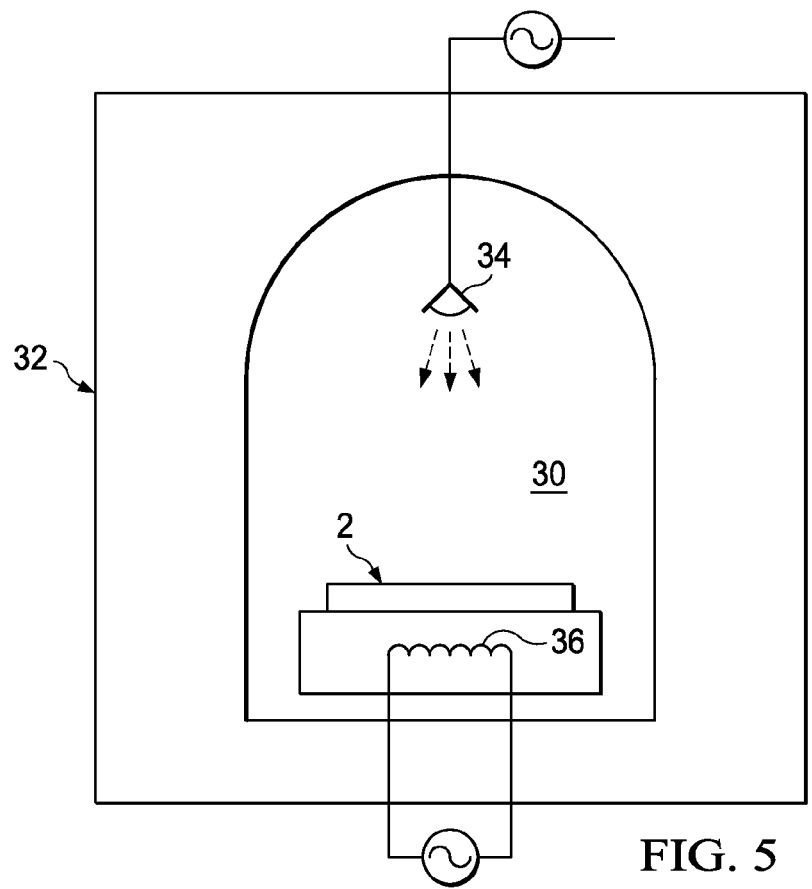
FIG. 5 illustrates an apparatus for epitaxially growing III-V compound semiconductor region using metal organic chemical vapor deposition (MOCVD)

Referring to FIG. 5, the annealing of wafer 2 may be performed in chamber 30 of production tool 32, which is configured for performing metal organic chemical mechanical vapor depositions (MOCVDs). In conventional MOCVD chambers, the heating of wafers were achieved using coils, and when temperatures of the wafers need to be lowered, inert gases are introduced to cool the wafers. The temperature lowering rate was accordingly low. In MOCVD tool 32, however, the annealing of wafer 2 is achieved using radiation source 34, which may be used for rapid thermal annealing (RTA). In an exemplary embodiment, radiation source 34 is a flash lamp, which heats wafer 2 to the annealing temperature.

Figure 7A:
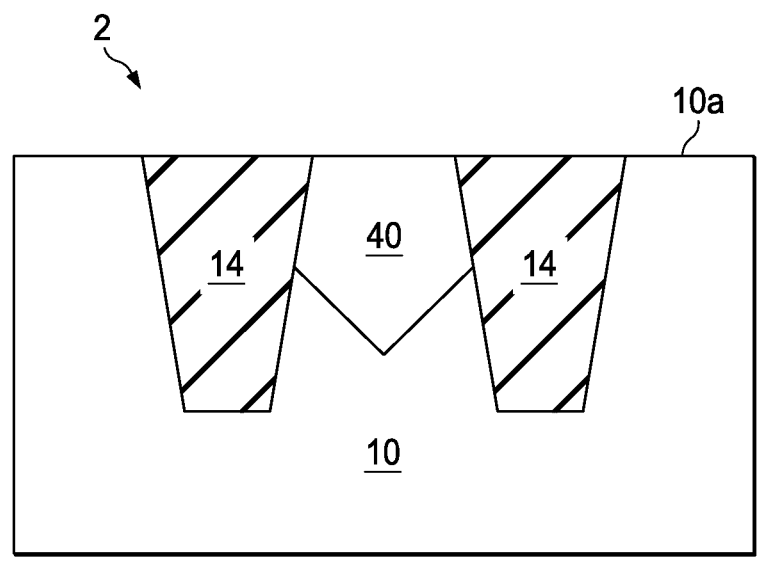
Figure 7B:
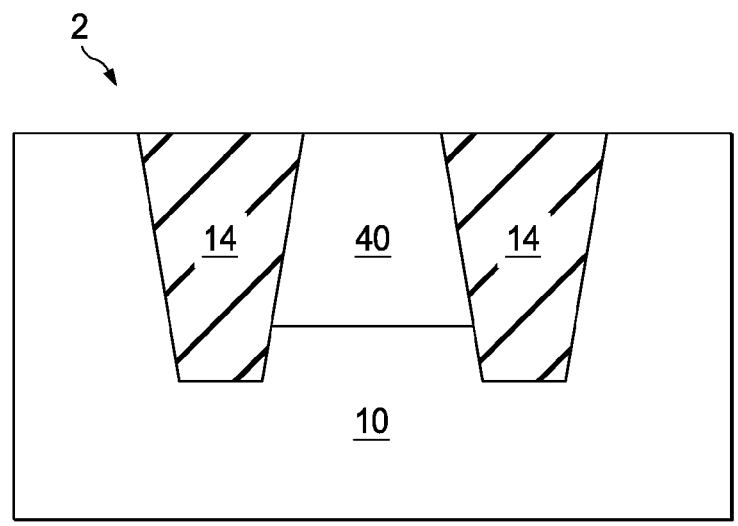

After the annealing, the temperature of wafer 2 is rapidly lowered to an epitaxial growth temperature used for epitaxially growing III-V compound semiconductor region 40, as shown in FIGS. 7A and 7B. In an embodiment, the epitaxial growth temperature is lower than about 400° C., and may be about 350° C., although it may be higher or lower. The steps of annealing wafer 2, the temperature lowering, and the epitaxially growth of III-V compound semiconductor region 40 may be in-situ performed, with no vacuum break occurring from the time the annealing is started to the time the epitaxial growth is ended. The lowering of the temperature may be achieved by either reducing the power of radiation source 34, or turning off the power of radiation source 34. The maintaining of the epitaxial growth temperature during the epitaxial growth may be achieved either through the use of coil 36 to heat wafer 2, or the use of radiation source 34 with the power provided to radiation source 34 lower than the power used for annealing.

Figure 6:
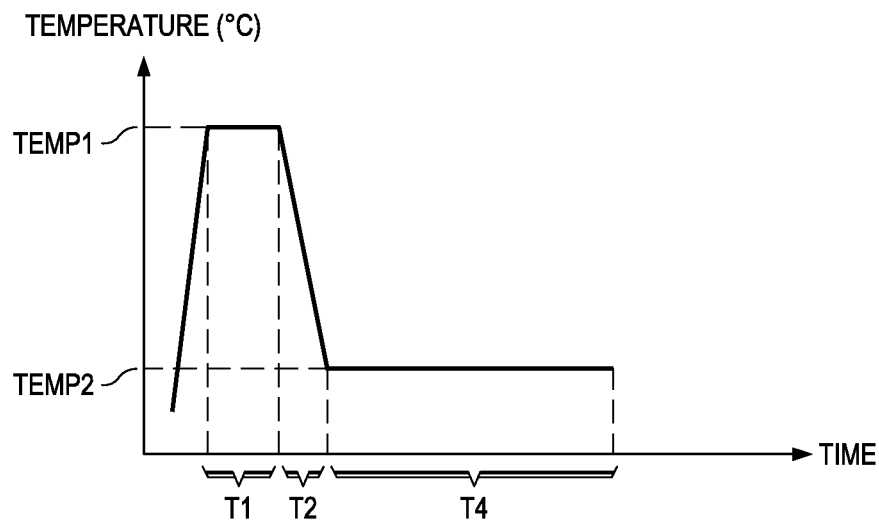
FIG. 6 illustrates the temperature of a silicon substrate as a function of time.

FIG. 6 schematically illustrates the temperature of wafer 2 as a function of time. Initially, wafer 2 may be at a room temperature. To perform the annealing, radiation source 34 (FIG. 5) heats wafer 2, so that the temperature of wafer 2 is rapidly increased to temperature temp1, which is the annealing temperature that is higher than about 900° C. After period of time T1, the annealing is finished, and Si(111):7×7 surfaces of wafer 2 are converted to Si(111): 1×1 surfaces.

After the annealing, a quenched temperature lowering is performed, which time period is denoted as T2. During time period T2, the power of radiation source 34 (FIG. 5) is either reduced or turned off. In an embodiment, the temperature lowering rate during an entire time period T2 is higher than about 0.5° C./second, higher than about 1° C./second, or even higher than about 5° C./second or 10° C./second. In an exemplary embodiment, the temperature lowering rate is between about 0.5° C./second and about 10° C./second.

Figure 7C:
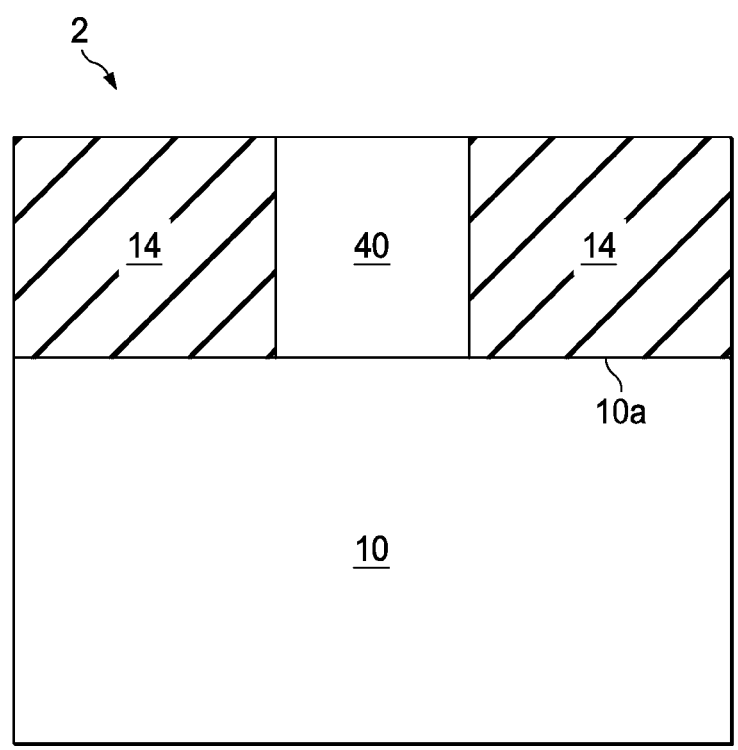

When the temperature of wafer 2 is lowered to temperature temp2, which is suitable for epitaxially growing III-V compound semiconductor regions, an epitaxial growth is performed to grow III-V compound semiconductor region 40 in trenches 18/24 (FIGS. 2A, 4A, and 4B). The exemplary resulting structures are shown in FIGS. 7A through 7C. With the rapid temperature lowering from temperature temp1 to temperature temp2 (FIG. 5), the Si(111): 1×1 surfaces formed at temperature temp1 do not change to Si(111):7×7 surfaces, even if during the temperature lowering process, the temperature of wafer 2 may pass a temperature range in which the transition from Si(111): 1×1 to Si(111):7×7 typically occurs. Accordingly, when the epitaxial growth of III-V compound semiconductor region 40 starts, the surface of substrate 10 is still a Si(111): 1×1 surface. The quality of the resulting III-V compound semiconductor region 40 is thus improved.

Referring again to FIGS. 7A through 7C, III-V compound semiconductor regions 40 may be formed of a III-V compound semiconductor material comprising, but is not limited to, GaAs, InP, GaN, InGaAs, InAlAs, GaSb, AlSb, AlAs, AlP, GaP, combinations thereof, and multi-layers thereof. The top surfaces of III-V compound semiconductor regions 40 may be level with, higher than, or lower than, top surfaces 10a of substrates 10.

In the embodiments, by performing an annealing to a silicon substrate before a III-V compound semiconductor region is epitaxially grown thereon, the undesirable Si(111):7×7 surface is converted to desirable Si(111):1×1 surface that is better suited for growing III-V compound semiconductors. Further, by rapidly lowering the temperatures of wafers from the annealing temperature to the growth temperature of III-V compound semiconductors, the Si(111):1×1 surfaces resulted from the annealing may be preserved until the III-V compound semiconductors are grown.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a device, the method comprising:
   forming shallow trench isolation (STI) regions extending into a silicon substrate;
   etching a portion of the silicon substrate between, and level with, opposite sidewalls of the STI regions to form a trench;
   when the trench is exposed, annealing the silicon substrate at a first temperature higher than about 900° C.;
   lowering a temperature of the silicon substrate from the first temperature to a second temperature, wherein a temperature lowering rate during the step of lowering the temperature is greater than about 1° C./second; and
   epitaxially growing a III-V compound semiconductor region in the trench using metal organic chemical vapor deposition (MOCVD).

2. The method of claim 1, wherein the temperature lowering rate is greater than about 5° C./second.

3. The method of claim 1, wherein the second temperature is lower than 400° C.

4. The method of claim 1,
   wherein in the step of etching the silicon substrate, the portion of the silicon substrate is etched to form the trench having a flat Si(111) surface, and wherein the III-V compound semiconductor region is grown on the flat Si(111) surface.

5. The method of claim 1, wherein the step of annealing, the step of lowering the temperature, and the step of epitaxially growing are in-situ performed in a production tool configured to perform the MOCVD.

6. The method of claim 1, wherein during a period between the step of annealing and the step of epitaxially growing the III-V compound semiconductor region, temperatures of the silicon substrate are maintained to be higher than or equal to the second temperature.

7. The method of claim 1, wherein the silicon substrate comprises a major top surface, and wherein the major top surface is a Si(111) surface having an off angle greater than about 12 degrees.

8. A method of forming a device, the method comprising:
   forming a dielectric layer over a top surface of a silicon substrate, wherein the top surface is a Si(111) surface having an off angle greater than about 12 degrees;
   patterning the dielectric layer to form an opening in the dielectric layer, wherein a portion of the top surface of the silicon substrate is exposed through the opening;
   when the portion of the top surface of the silicon substrate is exposed, annealing the silicon substrate at a first temperature higher than about 900° C.;
   lowering a temperature of the silicon substrate from the first temperature to a second temperature lower than about 400° C., wherein a temperature lowering rate during the step of lowering the temperature is greater than about 1° C./second; and
   epitaxially growing a III-V compound semiconductor region over and contacting the portion of the top surface of the silicon substrate using metal organic chemical vapor deposition (MOCVD).

9. The method of claim 8, wherein the temperature lowering rate is greater than about 5° C./second.

10. The method of claim 8, wherein after the step of annealing the silicon substrate, the silicon substrate comprises a Si(111):1×1 surface.

11. The method of claim 10, wherein during an entirety of the step of lowering the temperature from the first temperature to the second temperature, the Si(111): 1×1 surface is not converted to a Si(111):7×7 surface.

12. The method of claim 8, wherein the off angle tilts toward a <−1-12> direction of the silicon substrate.

13. The method of claim 8, wherein during a period between the step of annealing and the step of epitaxially growing the III-V compound semiconductor region, temperatures of the silicon substrate are maintained to be higher than or equal to the second temperature.

14. The method of claim 8, wherein the steps of annealing, lowering the temperature, and epitaxially growing the III-V compound semiconductor region are in-situ performed in a same chamber with no vacuum-break therebetween.

* * * * *